United States Patent [19]
Candore

[11] Patent Number: 5,292,388
[45] Date of Patent: Mar. 8, 1994

[54] CONVEYORIZED VACUUM APPLICATOR AND METHOD THEREFOR

[75] Inventor: Amedeo Candore, Bodio Lomnago, Italy

[73] Assignee: Morton International, Inc., Chicago, Ill.

[21] Appl. No.: 926,120

[22] Filed: Aug. 5, 1992

[30] Foreign Application Priority Data

Aug. 9, 1991 [IT] Italy .................. RM91-A00610

[51] Int. Cl.⁵ .............................................. B29C 65/00
[52] U.S. Cl. .................................... 156/64; 156/382; 156/361; 156/358; 156/368; 156/538; 156/539; 156/580; 156/583.5; 156/285; 100/93 P; 100/93 RP; 100/151; 100/154; 100/222; 198/956
[58] Field of Search ............... 156/580, 583.5, 285, 156/286, 329, 382, 297; 100/222, 93 RP, 151, 154, 93 P, 90; 198/956

[56] References Cited

U.S. PATENT DOCUMENTS

| | | | |
|---|---|---|---|
| 4,889,790 | 12/1989 | Roos et al. | 439/258 |
| 4,946,524 | 8/1990 | Stumpf et al. | 156/87 |
| 4,992,354 | 2/1991 | Axon et al. | 430/258 |
| 5,164,284 | 11/1992 | Briguglio et al. | 430/258 |

FOREIGN PATENT DOCUMENTS 0339275 11/1989 European Pat. Off. ...... B32B 31/10
0392226 10/1990 European Pat. Off. ...... B32B 31/04

*Primary Examiner*—David A. Simmons
*Assistant Examiner*—M. Curtis Mayes
*Attorney, Agent, or Firm*—Gerald K. White

[57] ABSTRACT

A method of and apparatus that is continuously automatically operative in an in-line system is described for applying under heat, vacuum and mechanical pressure a photoresist-forming layer to printed circuit boards that already have been prelaminated by the loose application thereto of dry film as discrete cut sheets within the confines of the surface of the boards whereby a laminate without entrapped air bubbles and closely conforming to the surface contours such as circuit traces of the printed circuit board is obtained. Featured is a two-part conveyorized vacuum applicator comprising as one part two input conveyors in end-to-end relation and as the other part a belt conveyor and vacuum laminator. The belt conveyor is characterized in its use of an endless belt having an aperture therein through which, in the vacuum laminating condition of the applicator, the movable lower platen of the vacuum laminator is movable upwards into sealing contact with the upper platen of the laminator, with the printed circuit board to be laminated and a portion of the upper run of the endless belt contained within the vacuum chamber of the laminator.

19 Claims, 12 Drawing Sheets

CONVEYORIZED VACUUM APPLICATOR AND METHOD THEREFOR

BACKGROUND OF THE INVENTION

1. Field of the Invention

The present invention is directed to an automatic conveyorized solder mask vacuum applicator and method of operation thereof having utility in the application of dry films which conform to the contours of irregular surfaces such as the surfaces of printed circuit boards or other substrates having raised, typically electrically conductive, traces thereon. The applicator and method have particular utility for conveying and for applying heat and vacuum and mechanical pressure to printed circuit boards or substrates that prior to such application have had dry film loosely applied to at least one of the surfaces thereof as discrete cut sheets within the confines of the printed circuit board.

2. Description of the Prior Art

A solder mask is a hard, permanent layer of non-conductive material which covers the surface of a printed circuit board or other substrate, encapsulating the traces of the printed circuit itself. By solder mask is meant herein a hard, permanent layer which meets at least the minimal requirements of the abrasion resistance tests as defined in IPC-SM-840A, Table 12, Summary of Criteria for Qualification/Conformance (Institute for Interconnecting and Packaging Electronic Circuits). The solder mask is patterned to fully cover the circuitry, except for those portions intended to be exposed, e.g., for soldering to another component. Solder masks are typically formed from a layer of photoimageable composition which is applied to a surface of the printed circuit board. The photoimageable layer is exposed to actinic radiation which is patterned by means of a template or artwork. Subsequent to exposure, the photoimageable layer is developed in an organic solvent or an aqueous solution which washes away either exposed or unexposed portions of the layer (depending upon whether the photoimageable material is positive acting or negative acting). The portion of the layer which remains on the surface is then cured, e.g., with heat and/or UV light, to form a hard, permanent solder mask intended to protect the printed circuitry for the life of the board.

One prior art method of applying the layer of photoimageable composition to the circuit board surface is to apply the material in liquid form, and then, either allow it to dry or partially cure the material to form a semi-stable layer.

There are a number of advantages to applying a photoimageable layer to a circuit board as a dry film rather than as a liquid. In particular, dry films are free of organic solvent and therefore eliminate this hazard from the workplace and eliminate the need for apparatus to protect the immediate work environment and the more general environment from organic solvent emissions. Typically, a dry film comprises a cover sheet of support material which is somewhat flexible but which has sufficient rigidity to provide structure to a layer of photoimageable composition which overlies one surface of the cover sheet. The cover sheet may be formed of polyester material, such a polyethylene terephthalate (PET), such as that sold as MELINEX ®.

To protect the photoimageable layer and to enable the dry film to be rolled, it is conventional for the exposed surface of the photoimageable layer to be covered with a removable protective sheet, e.g., a sheet of polyethylene. An example of such a dry film is sold as LAMINAR DM ® by Morton International, Inc.

The method of use of such prior art dry film is generally as follows. The protective sheet is removed from the photoimageable composition layer immediately prior to application of the dry film to the surface of the printed circuit board. This may be accomplished, for example, using automated apparatus which peels away and rolls up the protective sheet as the dry film is unrolled from a reel. The dry film is applied to the surface of the circuit board with the photoimageable layer in direct contact with the board surface. Using heat, vacuum and mechanical pressure, the photoimageable layer is immediately laminated to the surface of the board. The cover sheet remains overlying the photoimageable layer, protecting the photoimageable layer from exposure to oxygen and from handling damage. The cover sheet also permits a pattern (or template) to be laid directly on top of the dry film for contact printing, if contact printing is to be used (as is usually preferred from the standpoint of obtaining optimal image resolution). The dry film is exposed to patterned actinic radiation through the PET cover sheet. At this time, the PET cover sheet is removed, permitting access to the exposed photoimageable layer by developer. Depending upon the composition of the photoimageable layer, the photoimageable layer is developed with organic solvent, aqueous developer, or semi-aqueous developer. By semi-aqueous developer is meant herein a developer which is about 90% or more by volume aqueous solution with the balance being an organic solvent such as 2-butoxy ethanol and other glycol ethers. The photoimageable layer may either be positive acting, in which case the exposed portions are removed by developer, or negative acting, in which case the unexposed portions are removed by developer. Most photoimageable layers for preparing solder masks are negative acting. Most photoimageable composition layers require some cure subsequent to development to render the layer hard and permanent so as to serve as a solder mask. Depending upon the composition of the photoimageable layer, curing may be effected with heat and/or UV light.

Printed circuit boards almost invariably have uneven surfaces in which circuitry traces are raised or elevated over the surface of a board of electrically non-conducting material. Circuitry traces may be the residual portions of an etched metal layer or may be built up from the board surface. It is desirable that a solder mask, particularly one formed from a photoimageable composition, conform to the contours of a circuit board surface. A conforming solder mask which adequately covers both the board surface and the upstanding traces minimizes the use of expensive photoimageable composition.

Processes for applying conforming solder mask on a surface having raised areas such as circuit traces on a printed circuit board are disclosed in U.S. Pat. Nos. 4,889,790 Leo Roos et al. and 4,992,354 F. J. Axon et al. and in for U.S. patent application Ser. No. 480,487 filed Feb. 14, 1990. These patents and application are assigned to the assignee of the present invention. The disclosures thereof, by reference, are incorporated herein.

The processes disclosed in these patents and application involve applying a solder mask-forming photoimageable composition layer to a printed circuit board using a dry film in which an intermediate layer is interposed between a support film or cover sheet and the photoimageable layer. The intermediate layer of the dry film is selectively more adherent to the photoimageable composition layer than to the cover sheet, allowing the cover sheet to be removed after the photoimageable layer is applied to a printed circuit board with the intermediate layer remaining on the photoimageable composition layer as a "top coat." The top coat is of non-tacky material and can be placed in contact with other surfaces, such as artwork for contact printing. The top coat also serves as an oxygen barrier, allowing the photoimageable composition layer to remain unexposed on the printed circuit board, after cover sheet removal, for some length of time. The use of dry film having the "intermediate layer" or "top coat" make possible the processes described in these patents and application. In each case there is provided a conforming step, e.g., conforming vacuum lamination, after removal of the cover sheet. Because the cover sheet is removed prior to the conforming step, better conformance, particularly when applying thin photoimageable composition layers onto boards with closely spaced traces, is achieved. Better resolution is also achievable because the top coat may be directly contacted with artwork for contact printing and because the top coat is much thinner than a cover sheet or support film and is, therefore, much less a deterrent to good resolution than a support film.

To form a solder mask, the protective, removable sheet of the dry film is first peeled away and the exposed surface of the photoimageable composition layer is applied to the surface of the printed circuit board. Using heat, vacuum and mechanical pressure, the dry film is laminated to the surface of the printed circuit board, partially conforming the photoimageable layer thereto. Within about 60 seconds and before substantial cooling of the printed circuit board and dry film has occurred, the cover sheet of the dry film is removed, whereupon the photoimageable composition layer and overlying top coat fully conform to the contours of the printed circuit board and substantially encapsulate the traces. The photoimageable composition layer is then exposed to patterned actinic radiation through the top coat. A developer is used to remove either exposed or non-exposed portions of the photoimageable composition layer, leaving the remaining portion of the layer laminated to the circuit board. Subsequently, the portions of the photoimageable composition layer remaining on the circuit board are cured, e.g., with heat and/or UV light.

In U.S. Pat. No. 4,946,524 granted on Aug. 7, 1990 to Robert C. Stumpf et al., the disclosure of which patent, by reference, is incorporated herein, there is disclosed an applicator and process for applying dry film solder mask material to the surface of a printed circuit board allowing, at the same time, handling of the board with the applied film, the draw-off of the air enclosed between the film and the board, and the removal of the cover sheet. The draw-off of air enclosed between the dry film and the surface of the printed circuit board is facilitated when, before vacuum lamination, the surface of the board is covered with a loose sheet of film. To that end the applicator of U.S. Pat. No. 4,946,524 is operative to tack the dry film to a board at the leading and trailing edges with the intermediate portion of the film loosely applied thereto. The film is tacked to the board as a discrete cut sheet within the confines of the perimeter of the surface of the board. For convenience, a printed circuit board having such loose application of a dry film sheet to the surface or surfaces thereof is referred to hereinafter as being "prelaminated."

The results of the processes described above have been most encouraging. Difficulty has been encountered, however, in attempting to adapt these processes for continuous automatic operation in an in-line system. This is particularly true with respect to the utilization of existing vacuum laminating apparatus in an in-line process. The present invention was devised to fill the gap that has existed in the art in this respect.

SUMMARY OF THE INVENTION

An object of the invention is to provide an improved method of and apparatus for applying heat, vacuum and mechanical pressure to prelaminated printed circuit boards and substrates, thereby to remove all of the air between the dry film and the surface of the printed circuit board or substrate to assure complete conformance of the dry film around the circuit traces and the substrate surface contours.

Another object of the invention is to provide a method of laminating a prelaminated board comprising the steps of:
 (a) placing the board on the entrance end of a moving belt conveyor for movement into a vacuum laminator having an upper platen and a lower platen, which belt conveyor has an endless belt under tension that has an aperture therein and is characterized in having an initial or set-point position such that as the board is moved on the endless belt into the region of the vacuum chamber of the vacuum laminator the aperture is moved into alignment with and between the board and the lower platen;
 (b) sensing by proximity switch means having a member movable with the endless belt the positioning of the board in the vacuum chamber of the vacuum laminator and stopping the movement of the belt conveyor;
 (c) relieving the tension on the endless belt;
 (d) lifting the lower platen up through the aperture in the endless belt into sealing engagement with the upper platen and thereby capturing within the vacuum chamber of the vacuum laminator the board and the portion at least of the endless belt upon which the board is positioned; and
 (e) evacuating the vacuum chamber of the vacuum laminator.

Still another object of the invention is to provide a conveyorized dry film solder mask applicator that is characterized by the capacity thereof for continuous operation and the provision of a conveyor belt for conveying prelaminated printed circuit boards or substrates into and out of the vacuum chamber of a vacuum laminator.

A further object of the invention is to provide such a continuously operative conveyorized vacuum applicator that is operative, in association with first and second input rolls conveyors for feeding prelaminated printed circuit boards or substrates to the conveyor belt, in such a way as to allow one or more boards or substrates to be in the vacuum chamber of the vacuum laminator being vacuum laminated while the next boards or substrates to be vacuum laminated are arriving on the input rolls conveyors ready for the next vacuum lamination cycle of operation.

In accomplishing these and other objectives of the invention there is provided an apparatus for applying a conforming mask of dry film to a printed circuit board that operates automatically and includes a conveyor belt for carrying printed circuit boards into and out of the vacuum chamber of a vacuum laminator. The conveyor belt may be made of very thin (0.2 mm.) silicon rubber impregnated fiberglass cloth. This is to assure that the vacuum chamber of the vacuum laminator may be completely sealed when a vacuum is drawn.

The automatic conveyorized vacuum applicator may be operated to control the movement of the conveyor belt in a way to have one or more printed circuit boards in position in the vacuum chamber of the laminator at the same time with the next printed circuit boards staged in position on first and second input rolls conveyors for the next vacuum lamination cycle. Upon completion of the vacuum lamination cycle, the printed circuit boards are automatically conveyed out of the vacuum chamber and the staged new printed circuit boards to be vacuum laminated are conveyed into the vacuum chamber.

Upper and lower platens comprising the vacuum laminator are heated with the temperature thereof being monitored by suitable temperature measuring means that measure the temperature of the processed boards as they exit the vacuum chamber.

When the heated platens close and seal, vacuum is drawn to reduce the air pressure within the chamber thereby to draw air from between the loosely applied dry film and the surface or surfaces of the printed circuit board. At the end of the vacuum cycle, atmospheric air is allowed to enter the vacuum laminator and mechanical slap down pressure is applied by a movable air impervious resilient silicone blanket that is provided in association with the upper platen in the vacuum chamber.

The automatic conveyorized vacuum applicator has particular utility in conveying printed circuit boards and applying heat, vacuum and mechanical pressure to printed circuit boards that have been prelaminated with solder mask dry film fabricated in accordance with the processes described in the above identified U.S. patents and application and as disclosed in the aforementioned U.S. Pat. No. 4,946,524.

The conveyorized dry film solder mask applicator of the invention is an important component in the total arrangement of an automatic continuous flow of material in in-line processing of dry solder mask film and other films requiring vacuum lamination during processing.

The invention provides the means to automate the vacuum application process as an in-line system.

The various features of novelty which characterize the invention are pointed out with particularity in the claims annexed to and forming a part of the specification. For a better understanding of the invention, its operating advantages and specific objects attained by its use, reference is made to the accompanying drawings and descriptive matter in which preferred embodiments of the invention are illustrated.

BRIEF DESCRIPTION OF THE DRAWINGS

With this description of the invention, a detailed description follows with reference being made to the accompanying figures of drawing which form part of the specification in which like parts are designated by the same reference numbers and of which.

DESCRIPTION OF THE PREFERRED EMBODIMENTS

The conveyorized vacuum applicator according to the present invention has particular utility in the vacuum lamination of printed circuit boards and substrates of varying thicknesses and sizes, typically in a range from between 0.030 and 0.125 inches (0.08 and 0.32 cm.) and in a range from between 10×15 and 24×28 inches (25×150 and 60.96×71.12 cm.), which boards or substrates have been prelaminated with a loose sheet of dry film solder mask, as hereinbefore described. The specific function of the conveyorized vacuum applicator is to automatically apply a combination of heat, vacuum and mechanical pressure to completely remove all of the air between the dry film and the surface of the board or substrate to assure positive conformance of the dry film around etched circuit traces.

Figure 1:
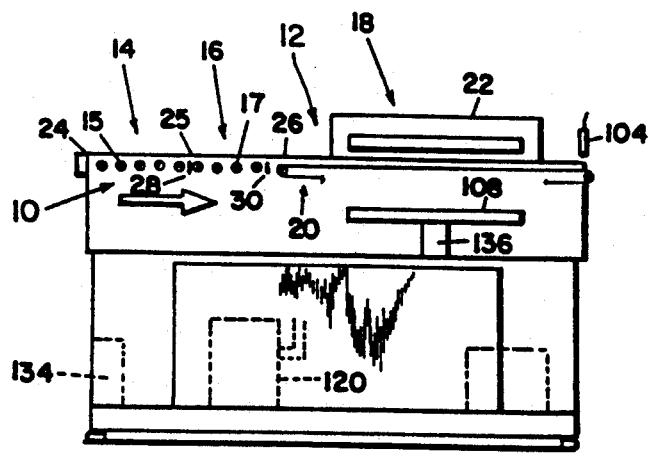
FIG. 1 is a side view of a cabinet structure in which the conveyorized vacuum applicator of the present invention is housed.
Figure 2:
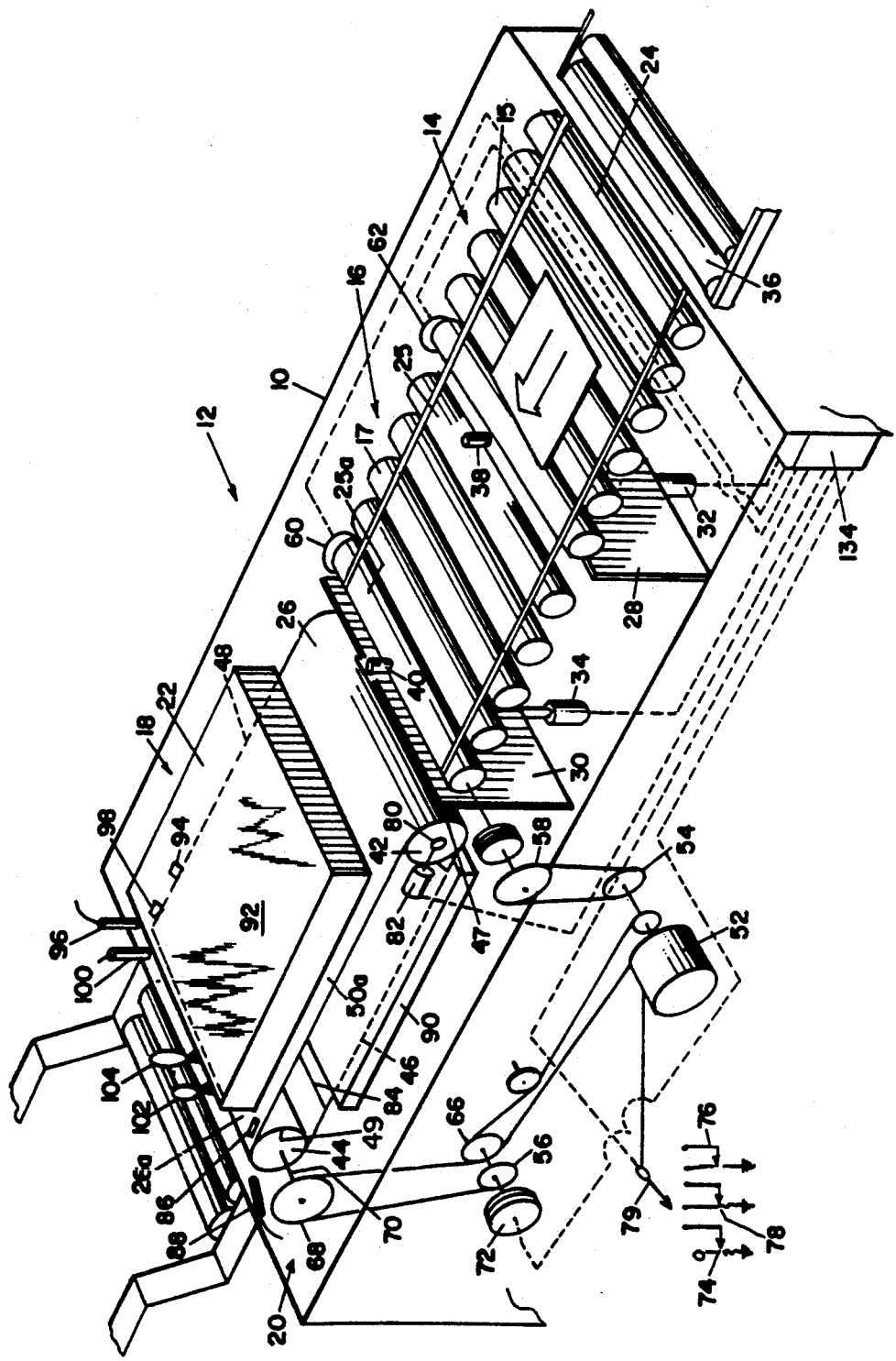
FIG. 2 is a diagrammatic perspective view on a scale larger than that of FIG. 1 illustrating the conveyor system of the conveyorized vacuum applicator for sequentially feeding prelaminated printed circuit boards or substrates through the vacuum laminator.

Referring to FIGS. 1 and 2 there is shown a support structure or frame 10 on which is mounted the conveyorized vacuum applicator, designated 12, according to the invention. The conveyorized vacuum applicator 12 is comprised of two parts. One part comprises first and second input conveyors 14 and 16, respectively. The other part comprises a vacuum section 18 which includes a ¾ belt conveyor 20 and a vacuum laminator 22.

As shown in FIG. 2, the input conveyors 14 and 16 and the ¾ belt conveyor 20 extend in end-to-end relation, in that order, from an entrance end 24 of input conveyor 14, from the entrance end 25 of input conveyor 16 to the exit end 25a thereof and from an entrance end 26 of the belt conveyor 29 to and exit end 26a thereof.

Each of the first and second input conveyors 14 and 16 comprise a plurality of chain coupled rolls 15 and 17, respectively, which rolls 15 and 17 extend for a substantial distance across the width of the applicator 12. Positioned for vertical movement between the input conveyors 14 and 16, as shown in FIGS. 1 and 2, is a first adjustable barrier 28. Similarly positioned for vertical movement between the exit end of the second input conveyor 16 and the entrance end 25 of the ¾ belt conveyor 20 is a second adjustable barrier 30.

Figure 3:
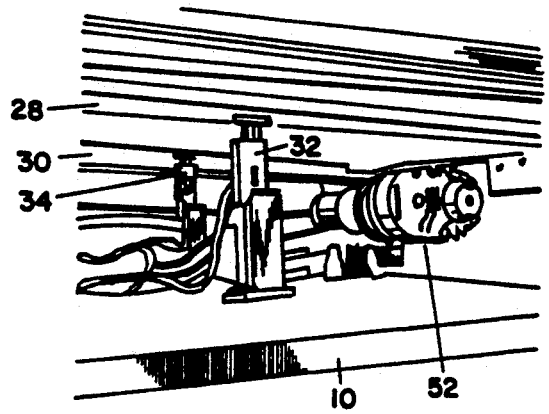
FIGS. 3-13 and 18 are fragmented detail views which illustrate various features of the applicator of FIGS. 1 and 2.

Each of the first and second barriers 28 and 30 extend across the width of the applicator 12 and is movable upwardly by an individually associated air cylinder 32 and 34, respectively, as shown in FIGS. 2 and 3. Such movement is from a "down" or non-blocking position to an "up" position to block the transport to the next succeeding conveyor 16 or 20, respectively, of a printed circuit board being transported on the input conveyors 14 and 16 from preceding equipment indicated at 36.

Figure 4:
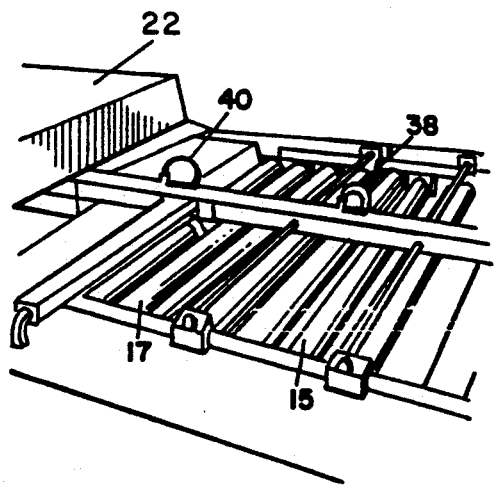

As seen in FIGS. 2 and 4, photocells 38 and 40 are provided for sensing the approach of a printed circuit board to the exit ends of the input conveyors 14 and 16, respectively, and for initiating the actuation of individually associated air cylinders 32 and 34 for effecting the movement of respectively associated barriers 28 and 30 between the printed circuit board non-blocking and blocking positions thereof.

The ¾ belt conveyor 20 includes a pair of rolls, specifically an input roll 42 and an output roll 44, both of which rolls extend across the width of the applicator 12. Wound around the rolls 42 and 44 are a pair of spaced endless chains 46 and 48 with the spacing being such that one chain 46 is on one side of applicator 12 and the other chain 48 is on the other side thereof. Chain 46 meshes with a gear 47 provided on the end of input roll 42 and a gear 49 provided on the end of the output roll 44, as shown in FIG. 2. Similarly, chain 48 meshes with gears provided on the other ends of the input roll 42 and the output roll 44. Thus, as shown in FIG. 7 chain 48 meshes with a gear 53 on the end of the output roll 44.

Figure 6:
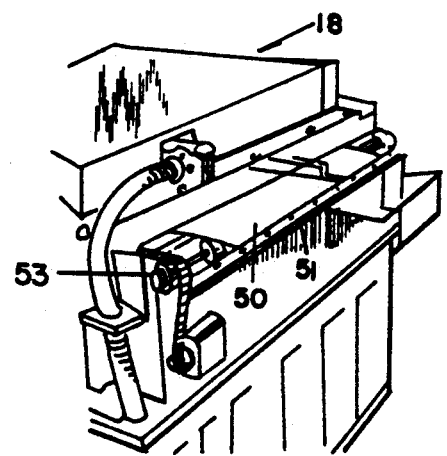
Figure 7:
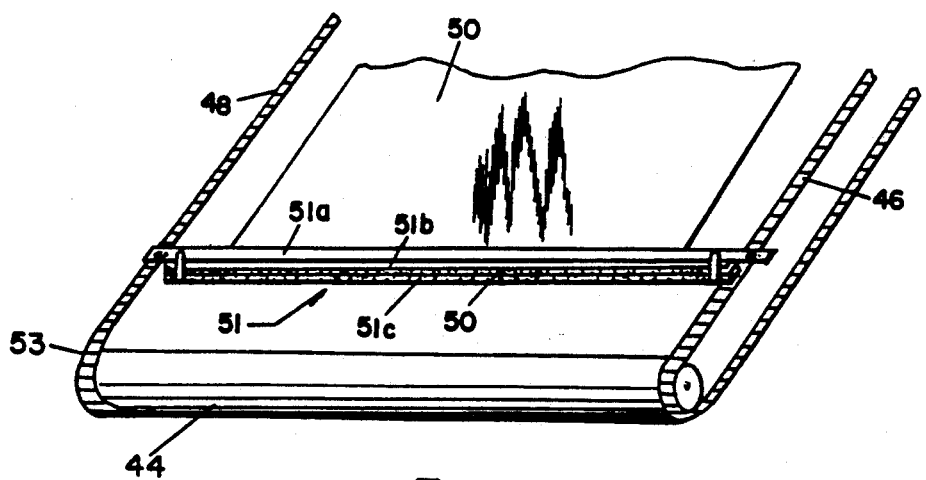

Positioned between the chains 46 and 48 and securely attached thereto at each end by a suitable gripper 51, as illustrated in FIGS. 6 and 7, is a belt 50 that extends about three quarters of the distance around the loop formed by the chains 46 and 48. The gripper 51 at each end of the belt 50 includes a bar 51a that is securely attached at one end to the chain 46 and at the other end to the chain 48. Carried by bar 51a and securely attached thereto by suitable bolts or rivets are bar members 51b and 51c of shorter length between which the end of belt 50 is captured and retained. Thus, as best seen in FIG. 2, the belt 50 has an aperture or opening 84 therein for the full width thereof, the length of which aperture 84 is about a quarter of the distance around the loop of the belt 50 around the input roll 42 and the output roll 44.

The belt 50 may be made of very thin fiberglass reinforced rubber. A total thickness of the belt in the range of 0.005 to 0.010 inches (0.013 to 0.025 cm.) is desirable to ensure that there is a complete seal when drawing a vacuum in the vacuum laminator 22. This is for the reason that the upper run 50a of the belt 50 is captured between the upper and lower platens of the vacuum laminator 22 during the vacuum lamination process.

Motive power for driving the chain coupled rolls of the input conveyors 14 and 16 and the ¾ belt conveyor 20 is provided by an electrical motor 52. Motor 52 may comprise a direct current electrical motor and is provided with separate drive gears 54 and 56 for driving the input conveyors 14 and 16 and the belt conveyor 20, respectively.

Figure 8:
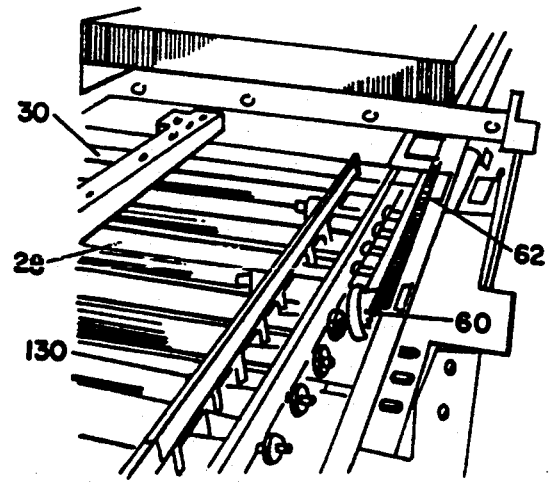

As shown in FIG. 2, motor 52 is coupled by gear 54 and chain drive gearing 58 to input conveyors 14 and 16. Selective or conjoint drive of the input conveyors 14 and 16 is provided by electromagnetic clutches 60 and 62. As best seen in FIG. 8, energization and deenergization of clutch 60 controls the rotation of the chain coupled rolls of the input conveyor 14. Similarly, energization and deenergization of clutch 62 controls the rotation of the chain coupled rolls of the input conveyor 16.

Motor 52 is coupled by gear 56 and chain drive gearing 66 and 68 to the drive shaft 70 of the output roll 44 of the ¾ belt conveyor 20. An electromagnetic clutch 72 positioned between chain drive gearing 68 and 70 provides for the selective control of the operation of the ¾ belt conveyor.

In accordance with the invention, the motor 52 is a variable speed motor, being selectively energizable from a source of direct current (not shown) through motor speed control potentiometers 74, 76 and 78 and a selector switch 79, as shown in FIG. 2, to drive the input conveyors 14 and 16 at a speed of about three (3) meters/minute (mts/min), to drive the input conveyors 14 and 16 and the ¾ belt conveyor 20 at a speed of about nine (9) mts/min, and to drive the ¾ belt conveyor 20 only at a speed of 30 mts/min, as further described hereinafter. The arrangement is such that the input conveyors 14 and 16 can be driven independently of each other and of the ¾ belt conveyor 20. Similarly, the ¾ belt conveyor can be driven independently of each the input conveyors 14 and 16. At no time, however, when driven at the same time, can the speeds of the conveyors 14, 16 and 20 be different.

Figure 5:
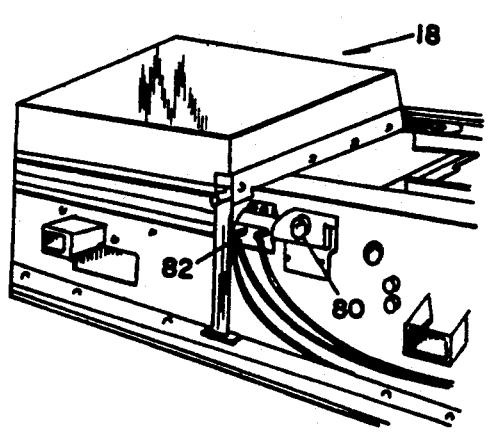

For the purpose of enabling the tension of the ¾ belt 50 of the ¾ belt conveyor 20 to be relieved at a desired point in the vacuum process, as shown in FIGS. 2 and 5, a bearing 80 in which the shaft of the input roll 42 of the ¾ belt conveyor 20 is mounted for rotation is arranged to be shifted a short distance toward and away from the vacuum laminator 22 by a two-position air cylinder 82.

Figure 9:
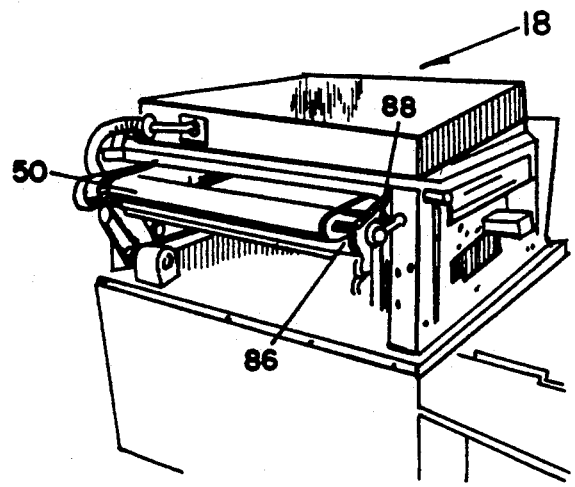
Figure 10:
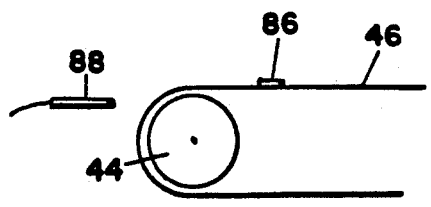

For sensing when a prelaminated printed circuit board has been moved by the belt conveyor 20 to a proper position relative to the vacuum laminator 22 for the vacuum lamination process to proceed, there is provided, as best seen in FIGS. 2, 9 and 10, a cam 86 and a sensor 88 that is disposed in cooperative relation therewith. Cam 86 is mounted on and moves with the endless chain 46 around the loop of the belt conveyor 20. Sensor 88 is mounted in any suitable manner on the frame 10 of the applicator 12.

When the printed circuit board is in the proper position relative to the vacuum laminator 22 for the vacuum lamination process to proceed, the aperture 84 in the belt 50 of the belt conveyor 20 is positioned immediately, that is, vertically, below the vacuum laminator, as best seen in FIG. 2. This allows the lower platen 90 of the vacuum laminator to be lifted up through the aperture 84 in belt 50 into cooperative relation with the upper platen 92 of the vacuum laminator 22 for effecting the vacuum lamination of a printed circuit board then resting on the surface of the upper run 50a of the belt 50 within the confines of the vacuum laminator 22.

There is an initial position of the belt conveyor 20 such that upon the transfer of a printed circuit board to the belt 50 from the input conveyor 16, the printed circuit board will be moved within the laminating region of the vacuum laminator 22 while the aperture 84 of the belt 50 is moved to a position vertically below the laminator 22. For convenience, that initial position of belt 50 is herein referred to as the "set-point" position of the belt conveyor 20.

Figure 11:
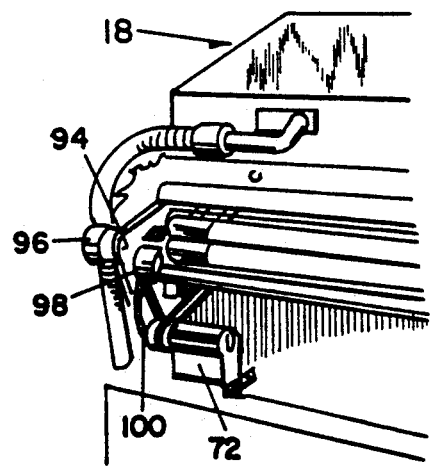
Figure 12:
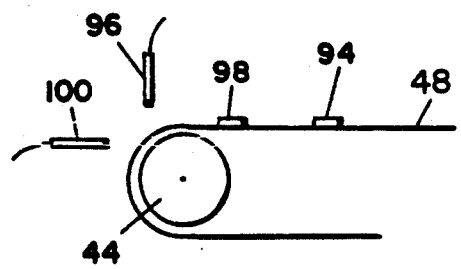

For sensing the set-point position of the belt conveyor 20, there is provided a cam 94 that is mounted on the endless chain 48 and a sensor 96 that may be mounted on the frame 10 of the applicator 12, as illustrated in FIGS. 2, 11 and 12.

In order to provide a signal anticipatory of the approach of the belt conveyor 20 to the set-point position thereby to enable relatively fast operation in the return of the belt conveyor 20 to the set-point position, there is also provided a cam 98 and a sensor 100 for slowing down the speed of the belt conveyor 20 to the set-point position, as illustrated in FIGS. 2, 11 and 12.

Figure 13:
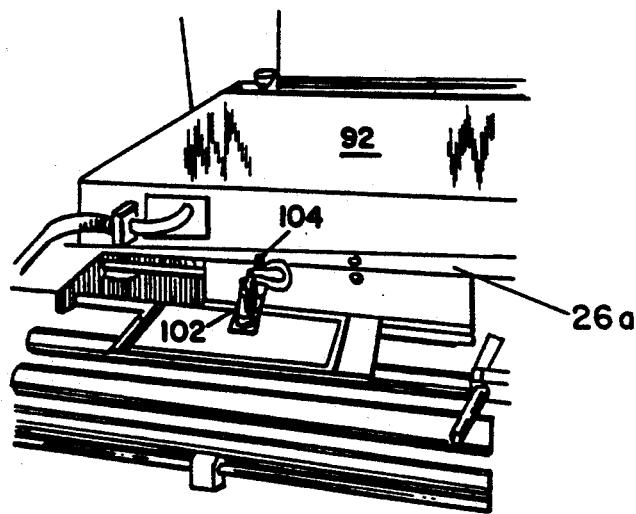

For detecting the presence of a processed printed circuit board or substrate at the exit end 26 of the belt conveyor 20, there is provided an output photocell 102, as shown in FIGS. 2 and 13.

Also, as shown on FIGS. 2 and 13, an infrared sensor 104 is provided for sensing the temperature of the processed printed circuit board or substrate as it is conveyed out of the laminator 22. The temperature of the processed printed circuit board or substrate, as sensed by sensor 104 and indicated or displayed by suitable means, facilitates control of the heating means in the vacuum laminator 22 thereby to preclude overheating thereof and possible damage to the printed circuit board or substrate being vacuum laminated.

Since the sheets of dry film applied to the prelaminated printed circuit boards being vacuum laminated have high flow characteristics in the temperature range of 30° C. to 100° C., the vacuum lamination process may be carried out within this range.

Figure 14:
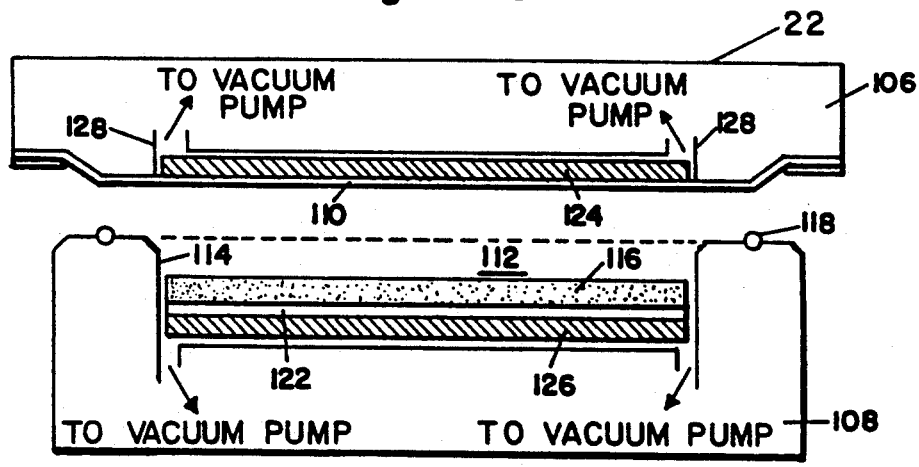
FIGS. 14-17 are cross sectional views of a vacuum laminator that advantageously may be used with the conveyorized vacuum applicator and which illustrate a platen operation sequence thereof.
Figure 15:
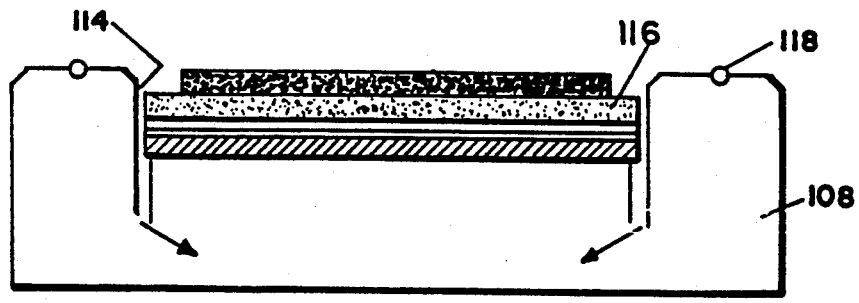

A vacuum laminator 22 that advantageously may be used in the conveyorized vacuum laminator 12 is illustrated in FIGS. 14, 15, 16 and 17. Referring to FIG. 14, the laminator 22 includes an upper stationary platen 106 and a lower movable platen 108. Associated with the upper platen 106 is a resilient silicon rubber blanket 110 that forms a ceiling for the vacuum chamber region indicated at 112 in FIGS. 14, 15 and 16. The lower platen 108 has a well 114 into which a prelaminated printed circuit board or substrate to be vacuum laminated is positioned on a silicon rubber insert 116 for vacuum lamination. Sealing means 118 in the form of an O-ring surrounding the circumference of the lower platen 108 is provided for hermetically sealing the well 114 for the evacuation of air therefrom by a vacuum pump 120 when the lower platen 108 is moved upward into contact with the upper platen 106. One or more shim inserts 122 may be provided, as shown in FIG. 14, to accommodate printed circuit boards of different thicknesses, that is, for adjusting the printed circuit boards to an optimum position in the well 114 for best vacuum lamination operation. Both platens 106 and 108 include heaters, specifically a heater 124 in the upper platen 106 and a heater 126 in the lower platen 108.

Printed circuit boards that have been prelaminated, that is, have had dry film solder mask previously loosely applied to one or both sides thereof, as described hereinbefore, are vacuum laminated in the vacuum laminator 22 in the following sequence:

(1) The board to be vacuum laminated is placed in the well 114 of the lower platen 108 on top of the silicon rubber insert 116. This is facilitated by relieving the tension on the belt 50 on the surface of which the board has been conveyed to the region of the vacuum chamber 112.

Figure 16:
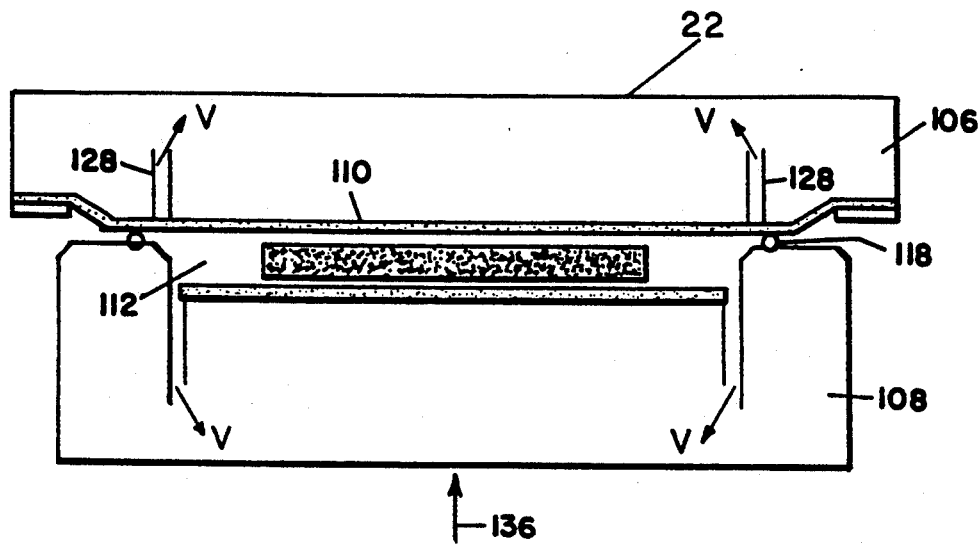

(2) The lower platen 108 is moved upward, as shown in FIG. 16, to seal, by means of the O-ring 118, the well 114 which together with the blanket 72 forms the vacuum chamber 112. Note that the belt 50 on which the board being vacuum laminated rests is also captured between the upper platen 106 and the lower platen 108.

(3) The vacuum process cycle is started by the energization of the vacuum pump 120 thereby to evacuate air from the vacuum chamber 112 and from the region between the upper platen 106 and the blanket 110.

Figure 17:
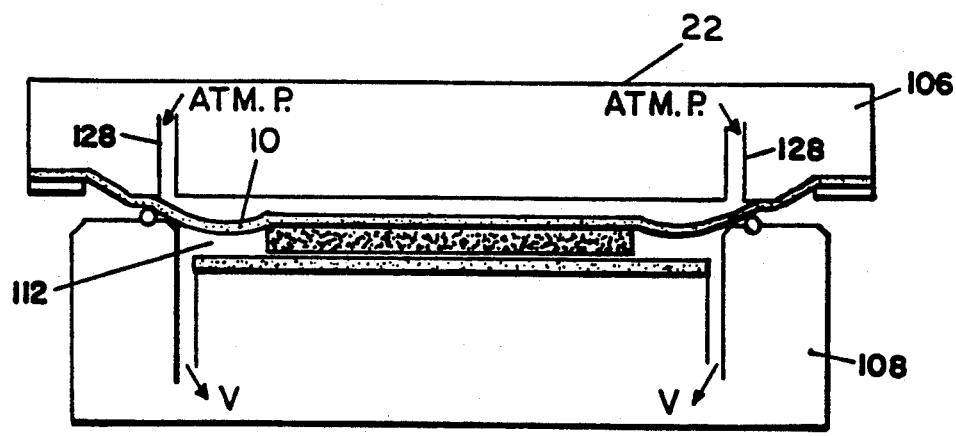
Figure 18:
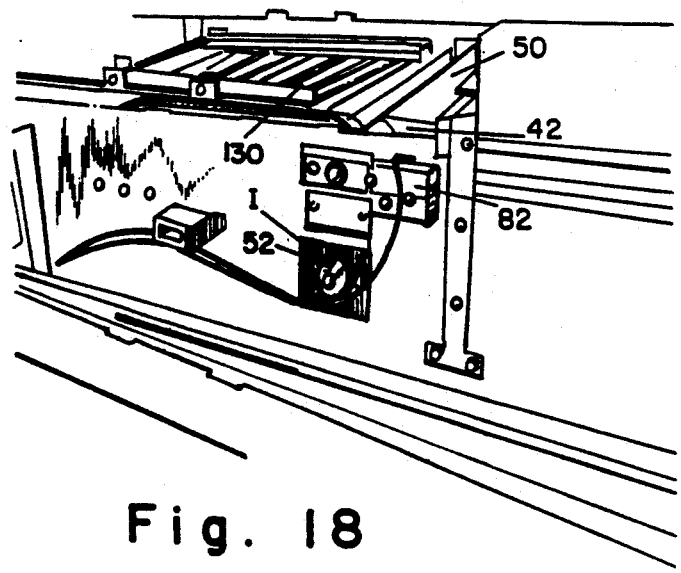

(4) For a short period at the end of a first stage of the vacuum process, there is a second stage or "slap down" of the blanket 110 in the upper platen 106, as shown in FIG. 17. This is effected by opening channels 128 in the upper platen 106 to allow atmospheric air to enter the space between the blanket 110 and the upper platen 106. Such slap down applies mechanical pressure on the printed circuit board to force the heated solder mask film to conform around the raised electrical circuit conductors.

(5) When the cycle is complete, the vacuum in the vacuum chamber 112 is released by allowing atmospheric air to enter therein whereby the lower platen 108 may be moved downward out of contact with the upper platen 106.

It is noted that, in accord with the invention, the prelaminated boards to be vacuum laminated by the conveyorized vacuum applicator 12 will have been centered by preceding equipment in the in-line system, although, if desired, adjustable guides 130 may be provided for that purpose in association with the input conveyors 14 and 16, as illustrated in FIG. 8.

The function cycle of the conveyorized vacuum applicator 12 with one board at a time being vacuum laminated is illustrated by FIGS. 19-27.

Figure 19:
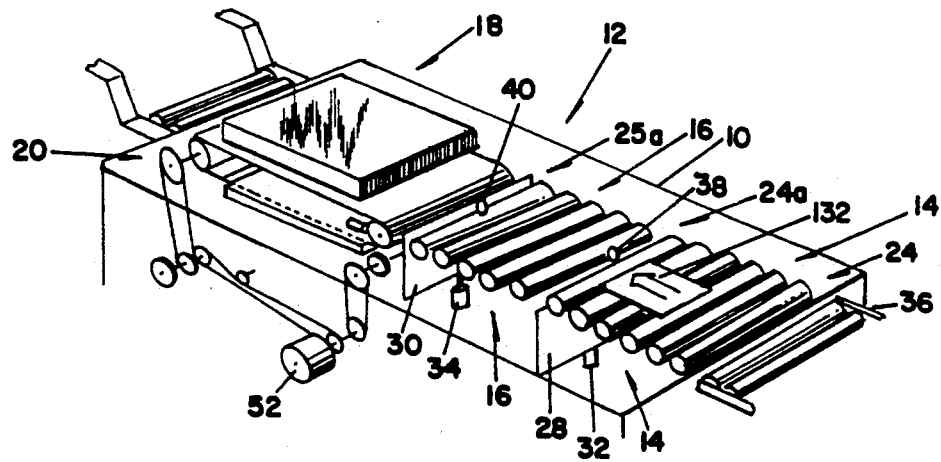
FIGS. 19-27 are diagrammatic perspective views on a smaller scale than shown in FIG. 2 that illustrate the function cycle of the conveyorized vacuum applicator when employed to feed printed circuit boards or substrates one at a time through the vacuum laminator.

In step 1 of the sequence, as shown in FIG. 19, a prelaminated circuit board 132 is shown arriving on the input conveyor 14 from preceding equipment running at a speed of 3 mts/min. The second barrier 30 is in the "up" board blocking position. The first barrier 28 is in the "down" position and allows the board 132 to be conveyed to the exit end 25a of the input conveyor 16.

Figure 20:
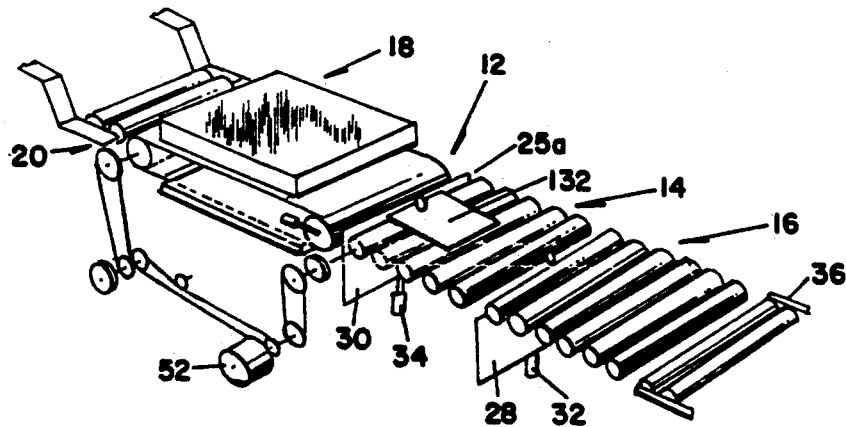

In step 2 of the sequence, as shown in FIG. 20, the board 132 is stopped by the second barrier 30 and is moved into alignment therewith, that is, squared up with respect thereto. As noted hereinbefore, the board 132 already has been centered on the conveyors 14 and 16, having been centered by preceding equipment or by adjustable guides 130 associated with the conveyors 14 and 16. The conveyor 16 is stopped, as by actuation of electromagnetic clutch 62 as soon as the board 132 is sensed at the exit end 25a thereof by the photocell 40.

Figure 21:
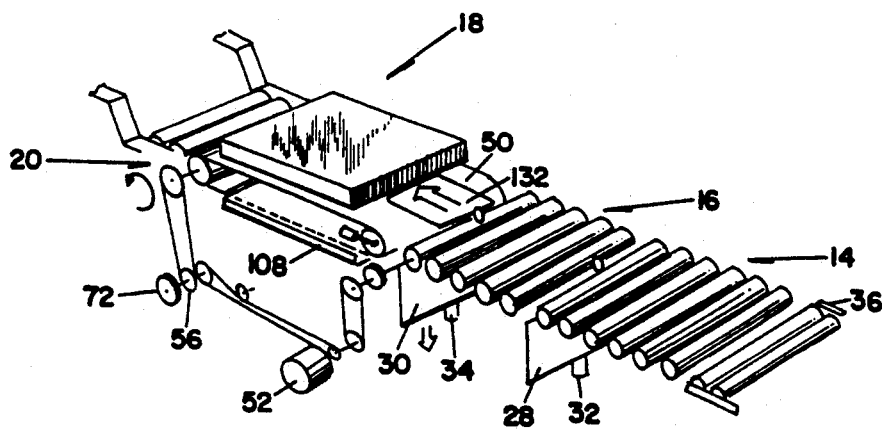

As controlled by a programmable logic controller (PLC) indicated schematically by the reference numeral 134 in FIG. 2, the second barrier 30 is actuated downwardly, by actuation of air cylinder 34 in step 3 of the sequence, as shown in FIG. 21, to release the board 132. Immediately thereafter the input conveyor 16 and the belt conveyor 20 are both started by appropriate energization of the direct current motor 52 for operation at a speed of 9 mts/min to load the board 132 onto the belt 50 on the belt conveyor 20 and thereby into vacuum chamber 112 of the vacuum laminator 22.

Figure 22:
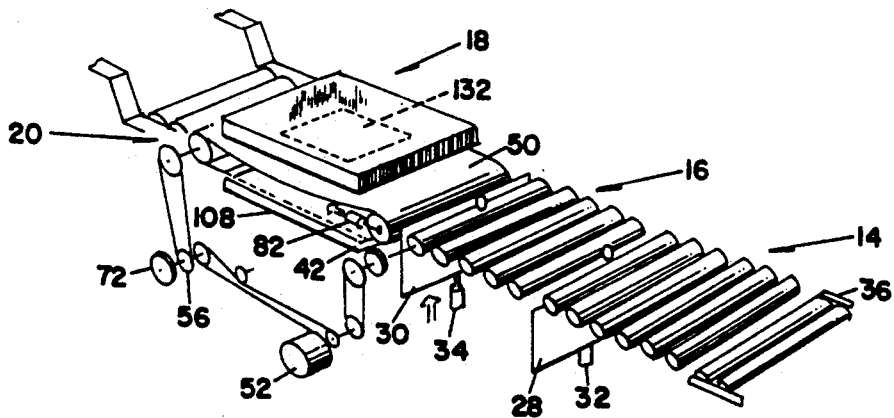

In step 4 of the sequence, as seen in FIG. 22, a cam 86 and cooperating sensor 88 provide a signal to stop the belt conveyor 20 and the input conveyor 16 when the board 132 is in the vacuum chamber 112 at a position directly vertically above the well 114 in the lower platen 108. The second barrier 30 is moved up by actuation of air cylinder 34 and the input roll 42 of the belt conveyor 20 is shifted by the actuation of the two-position air cylinder 82 in the direction of the vacuum chamber 112 in order to release the tension of the belt 50. The input conveyors 14 and 16 start to run at a speed of 3 mts/min. Being disengaged from the chain drive gearing 56 by the electromagnetic clutch 72, the belt conveyor 20 remains stationary.

Figure 23:
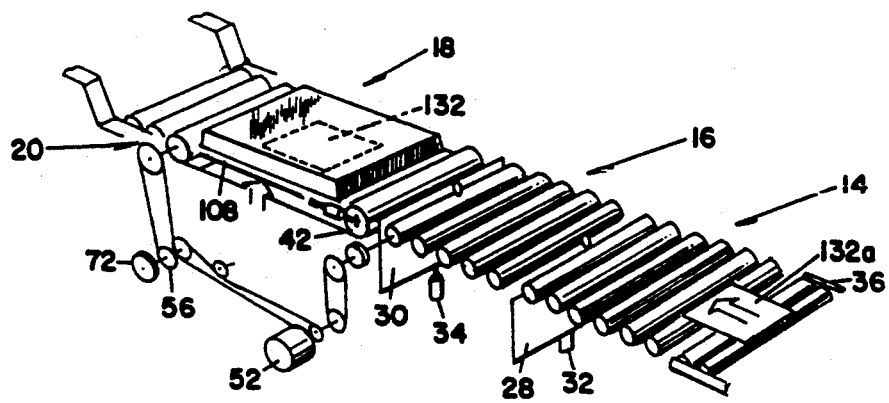

As seen in FIG. 23, in step 5 of the sequence, the lower platen 108 of the vacuum laminator 22 is moved vertically upward by a pneumatic ram 136. The platen 108 passes upward through the aperture 84 in the belt 50, which aperture 84 is then in vertical alignment with the lower platen 108. Vacuum pump 120 is actuated for a predetermined time in a first stage of the vacuum process, after which, for a short period, a slap down action, as described in connection with FIG. 17, is applied. During the vacuum phase the board 132 is heated by the heaters 124 and 126 of the upper and lower platens 106 and 108, respectively. Meanwhile, a new prelaminated board 132a to be vacuum laminated has arrived on the input conveyor 14, and with the first barrier 28 then in the down position, is moved to and is stopped at the second barrier 30 which, as shown in FIG. 23, is in the up position.

Figure 24:
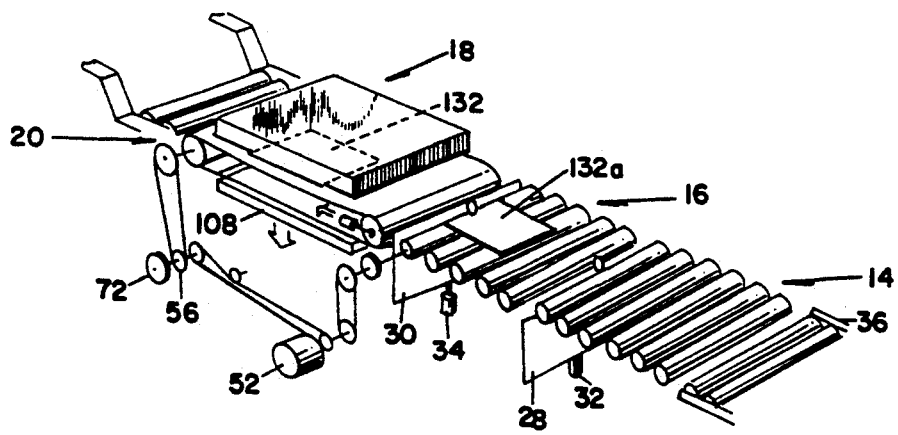

Step 6 of the sequence is shown in FIG. 24. This is after the vacuum process has been completed. The vacuum in the vacuum chamber 112 is released by actuating a valve to allow the introduction of atmospheric air into the vacuum chamber 112. The lower platen 108 is then lowered by the hydraulic cylinder 136 down through the aperture 84 in the belt 50 of the belt conveyor 20. The new board 132a is aligned or squared up on the second barrier 30 and the input conveyor 16 is stopped.

Figure 25:
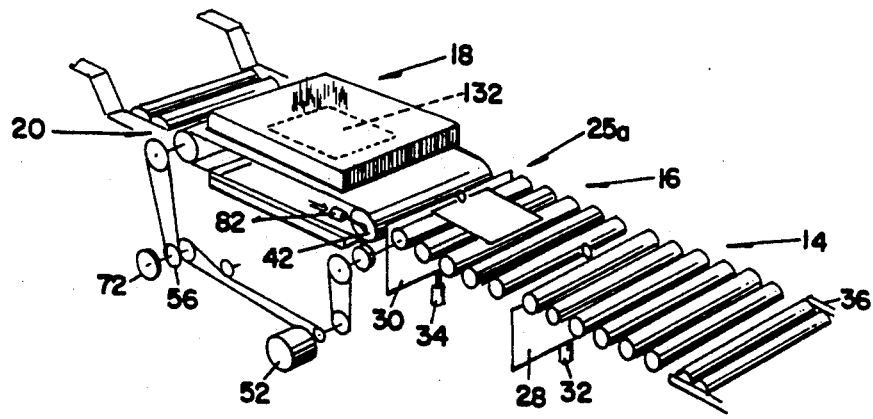

In FIG. 25, which shows step 7 of the sequence, the input belt roll 42 is moved back toward the exit end 25a of input conveyor 16 by the two-position air cylinder 34 to restore the tension of the belt 50 of the belt conveyor 20. The new board 132a is waiting in aligned position at the second barrier 30 on the input conveyor 16.

Figure 26:
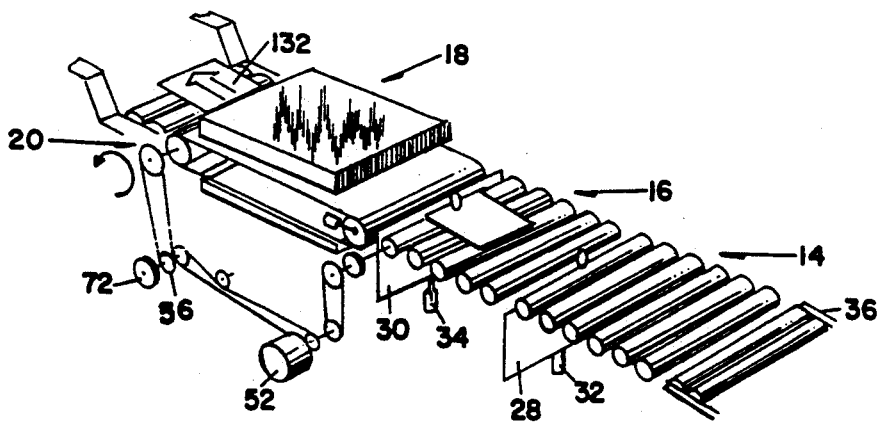

As shown in FIG. 26, which shows step 8 of the sequence, the actuation of the electromagnetic clutches 60, 62 and 72 is such that the belt conveyor 20 only starts. The energization of the motor 52 as controlled by the PLC 134 is then such that the belt conveyor 20 starts at a speed of 9 mts/min to effect a rapid unloading of the vacuum laminated or processed board 132.

Figure 27:
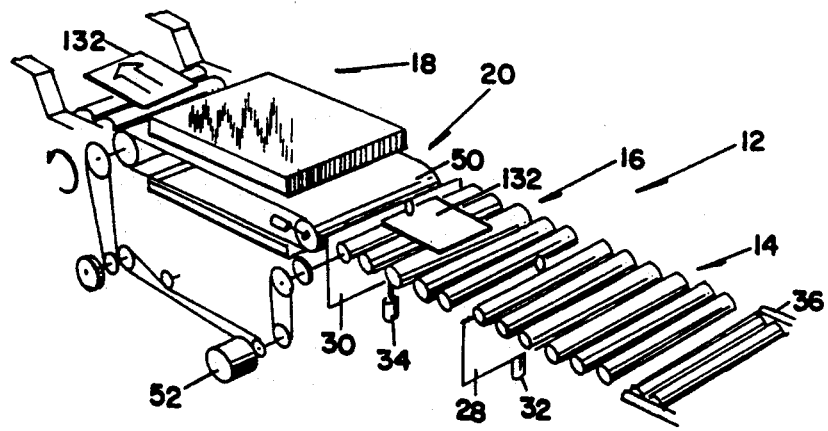

In step 9 of the sequence, shown in FIG. 27, as soon as the processed board 132 is completely off the belt 50, as sensed by the photocell 102, the speed of the belt conveyor 20 is increased to 30 mts/min in order to move the belt 50 quickly to the set point and to load a new board 132a that has been waiting at the entrance end 24 of input conveyor 14. A few centimeters before the set point is reached the speed of the belt conveyor 20 is slowed down to 3 mts/min and then the belt conveyor 20 is stopped precisely at the set point. The cycle restarts from step 2 illustrated in FIG. 20.

In FIGS. 28-36 there are shown diagrammatic perspective views that are similar to those of FIGS. 19-27 and which illustrate a second embodiment of the conveyorized vacuum laminator, according to the invention, that is operative sequentially to feed prelaminated printed circuit boards two at a time through the vacuum laminator.

The second embodiment of the conveyorized vacuum laminator, designated 12', consists essentially of the same parts as the conveyorized vacuum laminator 12 of the first embodiment illustrated in FIGS. 1-27 and differs primarily therefrom in the manner of the sequential operation of the parts and a requirement only for the vacuum chamber region 112 to be large enough to accommodate two boards 132 at the same time.

Figure 28:
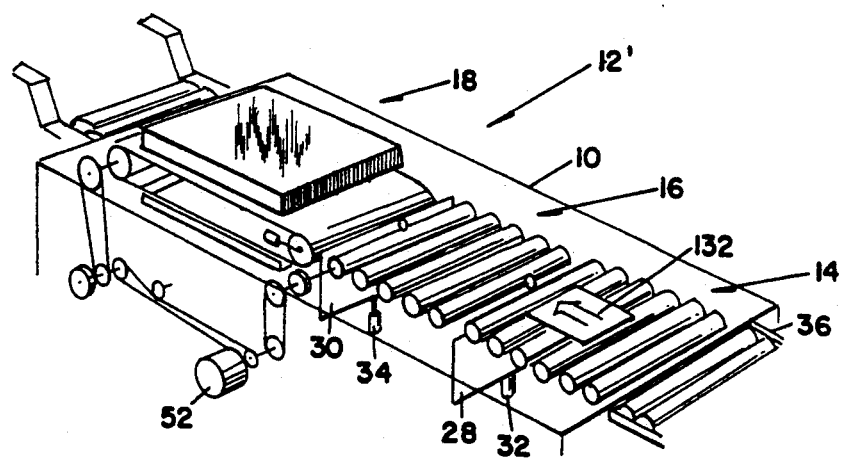
FIGS. 28-36 are diagrammatic perspective views that are similar to those of FIGS. 19-27, which illustrate the function cycle of the conveyorized vacuum applicator when employed sequentially to feed printed circuit boards or substrates two at a time through the vacuum applicator.

With respect to the function cycle of the vacuum laminator 12', in step 1, as shown in FIG. 28, a first prelaminated circuit board 132 having dry film loosely applied to the surfaces thereof is shown arriving from the prelaminator on the input conveyor 14 running at a speed of 3 mts/min. The second barrier 30 is up. The first barrier 28 is down.

Figure 29:
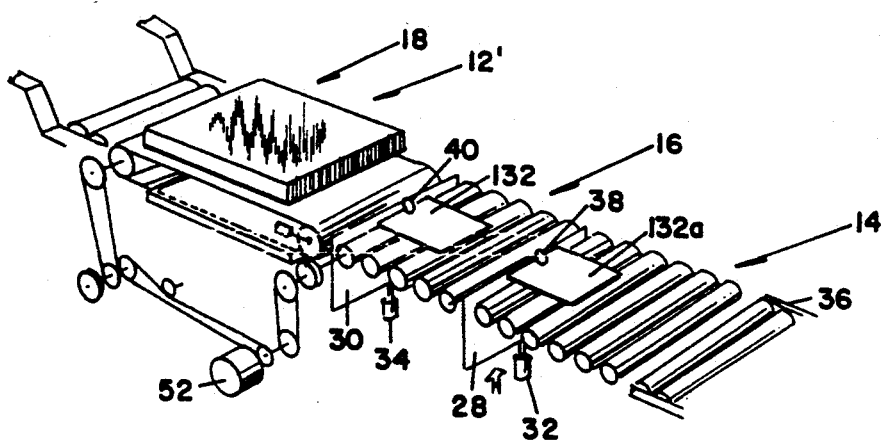

In Step 2 of the function cycle, as shown in FIG. 29, the first board 132 stops at the second barrier 30 and is aligned. The first barrier 28 goes up. A second board 132a stops on the first barrier 28 and also is aligned. The input conveyor 14 stops as soon as the first photocell 38 senses the arrival at the first barrier 28 of the second board 132a.

Figure 30:
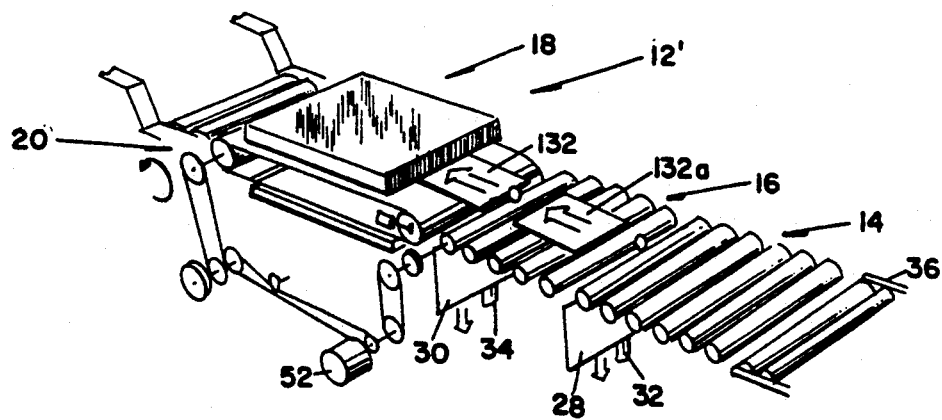

As shown in FIG. 30, in step 3 of the sequence both of the barriers 28 and 30 go down and both the input conveyors 14 and 16 and the conveyor belt 20 start at a speed of 9 mts/min to load the two boards 132 and 132a into the vacuum chamber 112 of the laminator 22.

Figure 31:
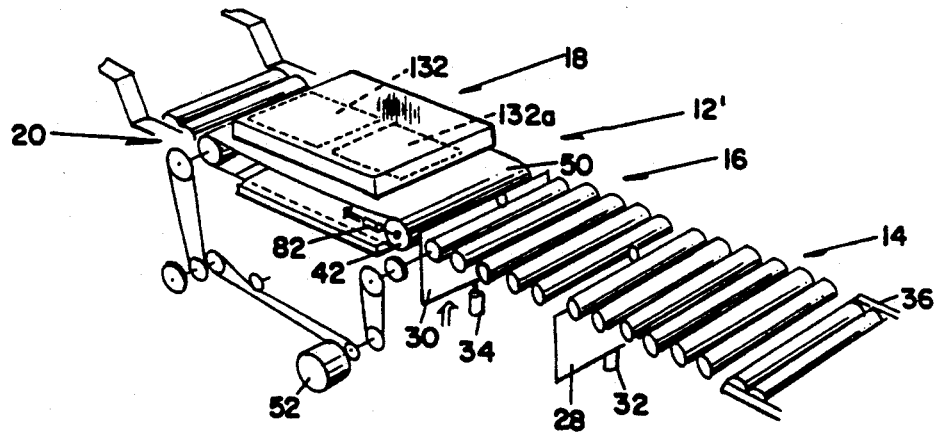

In step 4 of the sequence, as shown in FIG. 31, when the boards 132 and 132a are in the vacuum chamber 112, a signal from a cam 86 and sensor 88 causes the input conveyors 14 and 16 and the belt conveyor 20 to stop. The second barrier 30 goes up while the first barrier 28 remains down. The conveyor input belt roll 42 is moved in the direction of the vacuum chamber 112 in order to release the tension of belt 50. The input conveyors 14 and 16 start at a speed of 3 mts/min.

Figure 32:
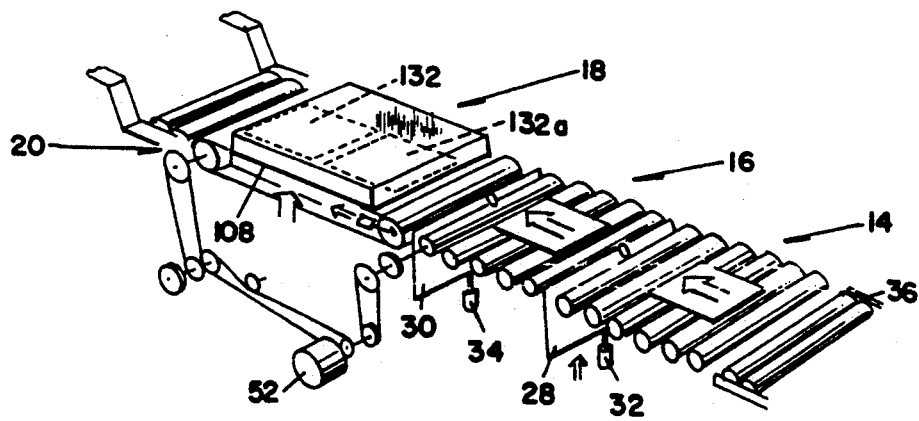

In step 5, as shown in FIG. 32, the lower vacuum platen 108 is actuated upwardly by the pneumatic cylinder 136 and passes up through the aperture 84 in the belt 50 to engage the upper platen 106. The vacuum pump 120 is actuated to evacuate the vacuum chamber 112 for a predetermined period in a first stage vacuum process, at the end of which process a slap down action is applied, as described hereinbefore. During the vacuum phase, the two boards 132 and 132a are heated by the platens 106 and 108. Two new prelaminated printed circuit boards 132b and 132c to be vacuum laminated are shown arriving on the input conveyors 14 and 16 and stop at the barriers 28 and 30, respectively.

Figure 33:
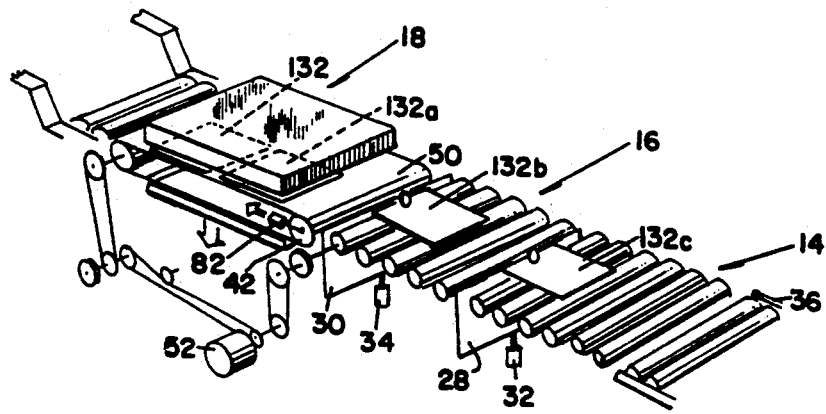

As shown in FIG. 33, after the vacuum process step 5, the vacuum is released from the vacuum chamber 112 in step 6 following which the lower platen 108 is lowered down through the aperture 84 in belt 50. The two newly arrived boards 132b and 132c are aligned on the barriers 28 and 30, respectively, and the input conveyors 14 and 16 stop.

Figure 34:
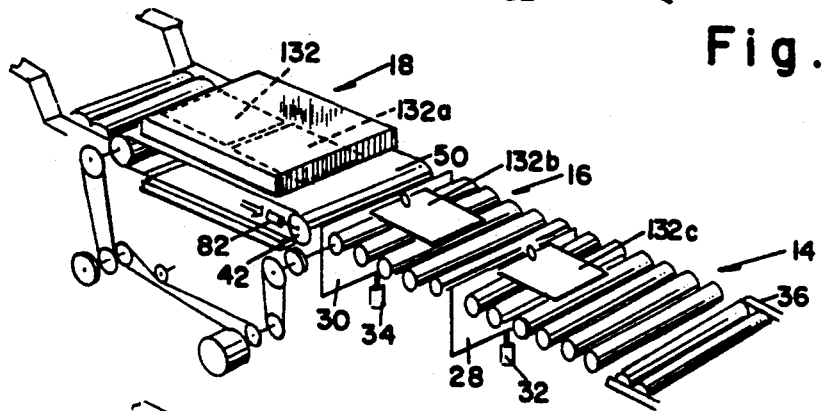

In step 7, as shown in FIG. 34, the input belt roll 42 is moved by the two-position air cylinders 82 back away from the vacuum chamber 112 to restore the tension of the belt 50. The new boards 132b and 132c are waiting on the input conveyors 16 and 14, respectively.

Figure 35:
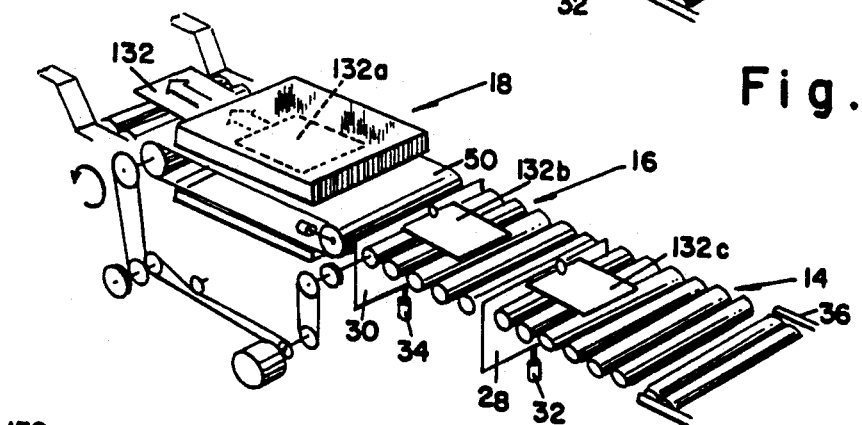

In step 8, as shown in FIG. 35, the belt 50 only starts to move at a speed of 9 mts/min to unload the two processed boards 132 and 132a from the vacuum laminator 22.

Figure 36:
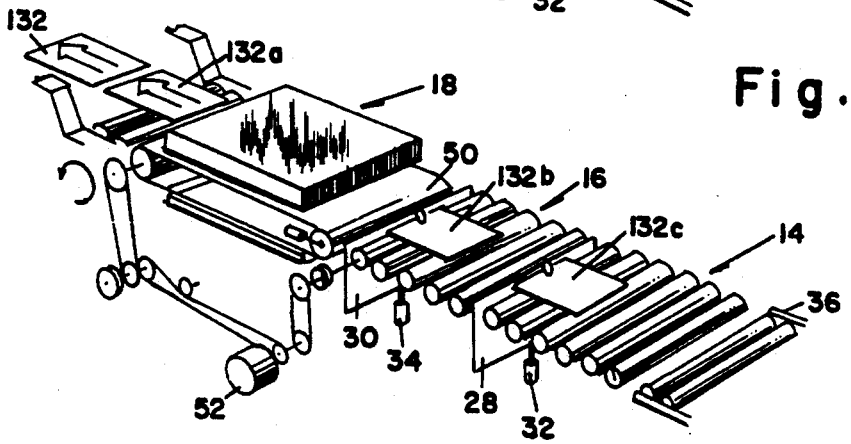

In step 9, as shown in FIG. 36, as soon as the two boards 132 and 132a are completely off the belt 50, the speed of the belt 50 of the conveyor belt 20 is increased to 30 mts/min in order quickly to move the belt 50 to the set-point for loading the new boards 132b and 132c on the belt 50, on the upper run thereof. A few centimeters before the set-point is reached the belt 50 is slowed down to 3 mts/min and then is stopped precisely at set-point. The cycle restarts from step 2.

The sensing switches comprising cam 86 and sensor 88, cam 94 and sensor 96, and cam 98 and sensor 100 may each be of the type known in the art as proximity switches, a non-contacting switch. More specifically, the cam may comprise a metallic object with the sensor, in each case, comprising an electronic device which is fixed in position and is responsive to the movement nearby of the metallic cam and is operative to generate an electrical signal in response to movement and hence sensing of the metallic object.

The programmable logic controller 134 utilized to control the sequential operation of the conveyorized vacuum applicator 12 for vacuum laminating one prelaminated board at a time or two prelaminated boards at a time may be a microprocessor controller of a type available commercially from Landis & Gyr. The controller 134 responds to the various signals produced by the photocells 38, 40 and 102 and by the proximity switch sensors 88, 96 and 100 to initiate, in concert with preprogrammed control data the several ensuing control functions including timing of the vacuum process laminating stages. These control functions include the actuation in the proper sequence of the air cylinders 32, 34 and 82, the pneumatic ram 136, and the electromagnetic clutches 60, 62 and 72, and the selector switch 79 for the motor speed control potentiometers 74, 76 and 78. For convenience of illustration, in FIG. 2 the control paths between the PLC 134 and the several control devices just mentioned have been shown in dotted lines. It will be understood that, although not shown, the dotted lines include, where necessary and appropriate, as well known to those skilled in the art, conversion devices such as electrically operated pneumatic valves to control the various air cylinders and the pneumatic ram, and electrical relay means to control the motor speed control selector switch 79.

The electrical circuit connections to the several input terminals (not shown) of the PLC 134 from the photocells 38, 40 and 102 and from the sensors 88, 96 and 100 have not been shown in order to avoid complication of the drawing since such circuitry is well known and understood by those skilled in the art.

With this description of the invention in detail, those skilled in the art will appreciate that modifications may be made in the invention without departing from the spirit thereof. Therefore, it is not intended that the scope of the invention be limited to the specific embodiments illustrated and described. Rather, it is intended that the scope of the invention be determined by the scope of the appended claims.

What is claimed is:

1. A method of vacuum laminating a prelaminated board comprising the step of:
   (a) placing the board on the entrance end of a moving belt conveyor for movement into a vacuum laminator having an upper platen and a lower platen, which belt conveyor has an endless belt under tension that has an aperture therein and is characterized in having an initial or set-point position such that as the board is moved on the endless belt into the region of the vacuum chamber of the vacuum laminator the aperture is moved into alignment with and between the board and the lower platen;
   (b) sensing by proximity switch means having a member movable with the endless belt the positioning of the board in the vacuum chamber of the vacuum laminator and stopping the movement of the belt conveyor;
   (c) relieving the tension on the endless belt;
   (d) lifting the lower platen up through the aperture in the endless belt into sealing engagement with the upper platen and thereby capturing within the vacuum chamber of the vacuum laminator the board and the portion at least of the endless belt upon which the board is positioned; and
   (e) evacuating the vacuum chamber of the vacuum laminator.

2. A method as defined by claim 1 further including the step of:
   (f) heating the upper platen and the lower platen of the vacuum laminator to a temperature at which the laminate on the board has a high flow characteristic.

3. A method as defined by claim 2 wherein the upper platen of the vacuum laminator includes a diaphragm that is substantially impervious to air and forms the ceiling of the vacuum chamber, and including the further steps of:
   (g) evacuating the space between the diaphragm and the upper platen;
   (h) at the end of a first stage of the vacuum process allowing atmospheric air to enter the space between the diaphragm and the upper platen thereby to cause the diaphragm to slap down and apply mechanical pressure on the board to force the laminate to conform closely to the surface contours of the board;
   (i) when the vacuum lamination process is complete allowing atmospheric air to enter the vacuum chamber;
   (j) lowering the lower platen down through the aperture in the belt;
   (k) restoring the tension in the belt; and
   (l) moving the endless belt to move the board out of the vacuum laminator.

4. A method as defined by claim 3 further including the step of:
   (m) continuing the movement of the endless belt to the set-point position thereof recited in step (a).

5. A method as defined by claim 4 wherein in step (m) the movement of the belt to the set-point position thereof is at a speed substantially higher than that at which the belt is moved when moving the board into and out of the region of the vacuum chamber of the laminator.

6. A method as defined by claim 4 comprising the further steps of:
   (n) placing on the entrance end of the conveyor belt another prelaminated circuit board; and
   (o) repeating steps (a) through (m).

7. A method as defined by claim 6 wherein in step (a) the rate of movement of the conveyor belt in conveying the board to the region of the vacuum chamber and in conveying the processed board out of the vacuum chamber is at a first speed, and the rate of speed in step (m) of moving the belt to the set-point position recited in step (a) is at a second and substantially higher speed than the first speed.

8. A method as defined by claim 7 wherein the first speed is 9 mts/min and the second speed is 30 mts/min.

9. A method as defined by claim 4 further including before step (a) the steps of:

(p) conveying on input conveying means a prelaminated board from preceding equipment to the belt conveyor;

(q) providing barrier means at the exit end of the input conveying means to stop the movement of the board and to align the board;

(r) sensing the presence of the board at the exit end of the input conveying means and stopping the movement of the input conveying means;

(s) adjusting the barrier at the exit end of the input conveying means to a non-stopping or non-blocking position; and (t) starting the input conveying means and the belt conveyor to load the board into the vacuum chamber of the vacuum laminator.

10. A method as defined by claim 9 wherein the rate of movement of the input conveying means in step (p) is about 3 mts/min, the rate of movement of the input conveying means and the belt conveyor in loading the board onto the entrance end of the belt conveyor is about 9 mts/min, and the rate of movement of the belt conveyor in step (m) in continuing the movement of the endless belt to the set-point position is about 30 mts/min.

11. A method as defined by claim 4 further including before step (a) the steps of:

(u) conveying on first and second input conveying means first and second prelaminated boards from preceding equipment to the belt conveyor;

(v) providing first and second barrier means with the first barrier means at the exit end of the first conveyor means and the second barrier means at the end of the second input conveyor, the first barrier means being in a non-blocking position and the second barrier means being in a blocking position whereby the first board is stopped by the second barrier at the exit end of the second input conveyor and is aligned;

(w) adjusting the position of the first barrier means at the exit end of the first input conveyor to the blocking position whereby the second board is stopped by the first barrier at the exit end of the first conveyor and is aligned;

(x) sensing the presence of the second board at the exit end of the first conveyor and stopping the first and second input conveyors;

(y) adjusting both of the first and second barriers to the non-blocking position;

(z) starting both of the first and second conveyors and the belt conveyor to load the first and second boards in succession into the vacuum chamber of the vacuum laminator; and wherein in step (b) the positioning of both the first and second boards is sensed to stop the movement of the belt conveyor and the first and second input conveyors;

wherein in step (c) the tension on the endless belt is relieved, the second barrier is adjusted to the blocking position and the first and second input conveyors are started;

wherein in step (d) two new prelaminated boards arrive on the first and second input conveyors from preceding equipment and are stopped at the first and second barriers, respectively, wherein in step (j) the two new boards are aligned on the first and second barriers, respectively, and the first and second input conveyors are stopped; and wherein in step (1) as soon as the two processed boards are out of the vacuum laminator and off the endless belt the rate of movement of the endless belt is increased rapidly to move the endless belt to the set-point position.

12. Apparatus for vacuum laminating a prelaminated board comprising, a vacuum laminator having a relatively stationary upper platen and a lower platen that is adapted to be moved up into sealing engagement with said upper platen to form a vacuum chamber;

a belt conveyor having an entrance end and an exit end and positioned in operative relationship with said vacuum laminator such that, when moved from a set-point position thereof with a prelaminated board placed on the entrance end thereof, the board is moved into the vacuum chamber region between the upper and lower platens, said belt conveyor including a belt under tension upon which the board is placed at the entrance end of the belt conveyor and having an aperture therein so positioned with respect to the entrance end of the belt conveyor that as the board is moved into the region of the vacuum chamber between the upper and lower platens the aperture is moved into alignment between the board and the lower platen;

motive means operative to cause said belt to move with a board placed on the entrance end of the belt conveyor thereby to position said board in the region of the vacuum chamber of said vacuum laminator;

first sensing means providing a signal responsive to the movement of said belt required to position the board in the region of the vacuum chamber for stopping said motive means from causing further such movement;

tension adjusting means operative to relieve the tension of said belt;

lifting means operative to lift the lower platen up through the aperture in the belt into sealing engagement with the upper platen thereby to capture the board and the portion, at least, of the belt upon which the board is positioned within the vacuum chamber;

vacuum pump means to evacuate the vacuum chamber; and control means responsive to the signal provided by said first sensing means to control said motive means, said tension adjusting means, said lifting means, and said vacuum pump means.

13. Apparatus as defined by claim 12 further including heating means for heating the upper platen and the lower platen of the vacuum laminator to a temperature at which the laminate on the board has a high flow characteristic.

14. Apparatus as defined by claim 13 wherein the upper platen of the vacuum chamber includes a diaphragm that is substantially impervious to air and forms the ceiling of the vacuum chamber, and further including:

a first communicating passage between said vacuum pump and the space between said diaphragm and the upper platen controlled by said control means for evacuating said space;

a second communicating passage between the space between said diaphragm and the upper platen and atmospheric air controlled by said control means at the end of a first stage of the vacuum lamination process to allow air at atmospheric pressure to enter such space to cause the diaphragm to slap down and apply mechanical pressure on the board to force the laminate to conform closely to the surface contours of the board;

a third communicating passage between said vacuum chamber and atmospheric air controlled by said control means when the vacuum lamination process is complete allowing air at atmospheric pressure to enter the vacuum chamber;

said control means then being operative to actuate said lifting means to lower said lower platen down through the aperture in the belt, to actuate said tension adjusting means to restore the tension of the belt, and to actuate said motive means to move the processed board out of the region of the vacuum chamber.

15. Apparatus as defined by claim 14 further including second sensing means providing a signal responsive to the board moving off the belt conveyor at the exit end thereof for causing said motive means to continue the movement of the belt to the set-point position of the belt conveyor;

third sensing means providing a signal responsive to the approach of the belt to the set-point position of the belt conveyor to cause said motive means to slow down the movement of the belt to the set-point position; and fourth sensing means providing a signal responsive to the movement of the belt to the set-point position of the belt conveyor to cause said motive means to stop the belt conveyor with the belt at the set-point position.

16. Apparatus as defined by claim 15 wherein the rate of movement of the belt conveyor by the motive means in moving the board into and out of the region of the vacuum chamber of the vacuum laminator is at a first speed and the rate of movement of the belt by the motive means when continuing to move the belt to the set-point position of the belt conveyor is at a second speed that is higher than the first speed.

17. Apparatus as defined by claim 16 wherein the first speed is about 9 mts/min and the second speed is about 30 mts/min.

18. Apparatus as defined by claim 15 further including:

a first input conveyor;

a second input conveyor;

each of said first and second input conveyors being arranged to be driven under the control of said control means by said motive means through respectively associated first and second electromagnetic clutch means, said first and second input conveyors each having an entrance end and an exit end and being operative to convey prelaminated boards from preceding equipment to the entrance end of said belt conveyor;

first barrier means at the exit end of said first input conveyor;

second barrier means at the exit end of said second input conveyor;

each of said barrier means having a board blocking position and a board non-blocking position with said first barrier being in the board non-blocking position and the second barrier being in the board blocking position;

a first air cylinder to adjust the position of said first barrier means between the board blocking and non-blocking positions;

a second air cylinder to adjust the position of said second barrier means between the board blocking and non-blocking positions;

a first photocell for sensing a board at the exit end of said first conveyor means;

a second photocell for sensing a board at the exit end of the second conveyor means, said second photocell producing a signal in response to the presence of a board at the exit end of the second input conveyor means to cause the control means to stop the movement of said first and second input conveyors and to adjust said second barrier means to a non-blocking position, following which said control means causes the motive means to start both the input conveyors and the belt conveyors to load the board onto the entrance end of the belt conveyor.

19. Apparatus as defined by claim 15 further including:

a first input conveyor;

a second input conveyor;

each of said first and second input conveyors and said belt conveyor being arranged to be driven under the control of said control means by said motive means through respectively associated first, second and third electromagnetic clutch means;

said first and second input conveyors each having an entrance end and an exit end and being operative to convey prelaminated boards from preceding equipment to the entrance end of said belt conveyor;

first barrier means at the exit end of said first input conveyor;

second barrier means at the exit end of said second input conveyor;

each of said barrier means having a board blocking position and a board non-blocking position with said first barrier being in the non-blocking position and said second barrier in the blocking position;

a first air cylinder controlled by said control means to adjust the position of said first barrier means from the board non-blocking position to the blocking position;

a second air cylinder controlled by said control means to adjust the position of said second barrier means from the board blocking to the non-blocking position;

a first photocell for sensing a board at the exit end of the first input conveyor means;

a second photocell for sensing a first board at the exit end of the second input conveyor means and producing a signal in response to the presence of a board to effect the actuation by said control means of said first air cylinder to adjust said first barrier to the blocking position;

said first photocell producing a signal in response to a second board at the exit end of the first input conveyor to effect the actuation by said control means of said first and second electromagnetic clutch means to stop the first and second input conveyors followed by the actuation by said control means of said first and said second air cylinder to effect the adjustment of said first and second barrier means to the non-blocking positions and the actuation of said first and second electromagnetic clutch means to start said first and second conveyors and to start said belt conveyor to load the two boards in succession onto the entrance end of the belt conveyor.

* * * * *